United States Patent [19]

Acket

[11] 4,137,122
[45] Jan. 30, 1979

[54] METHOD OF MANUFACTURING A SEMICONDUCTOR DEVICE

[75] Inventor: Gerard A. Acket, Eindhoven, Netherlands

[73] Assignee: U.S. Philips Corporation, New York, N.Y.

[21] Appl. No.: 795,733

[22] Filed: May 11, 1977

[30] Foreign Application Priority Data

May 17, 1976 [NL] Netherlands ................. 7605234

[51] Int. Cl.² .................. H01L 21/66; G01N 21/02
[52] U.S. Cl. ................................. 156/601; 29/574; 148/1.5; 148/175; 156/610; 427/10
[58] Field of Search ............... 148/175, 1.5; 156/601, 156/626, 610; 29/574; 427/9, 10; 356/44, 51, 161, 201, 204

[56] References Cited

U.S. PATENT DOCUMENTS

| | | | |
|---|---|---|---|
| 3,099,579 | 7/1963 | Spitzer et al. | 156/601 |
| 3,322,575 | 5/1967 | Ruehrwein | 148/175 X |
| 3,436,549 | 4/1969 | Pruett | 148/175 X |
| 3,524,776 | 8/1970 | Hampikian et al. | 148/175 X |
| 3,620,814 | 11/1971 | Clark et al. | 427/10 |
| 3,647,581 | 3/1972 | Mash | 148/175 |
| 3,696,262 | 10/1972 | Antypas | 148/175 X |
| 3,745,834 | 7/1973 | Veltze et al. | 156/601 X |
| 4,018,566 | 4/1977 | Zeuch et al. | 156/601 X |
| 4,024,291 | 5/1977 | Wilmanns | 427/10 |

Primary Examiner—L. Dewayne Rutledge
Assistant Examiner—W. G. Saba
Attorney, Agent, or Firm—Thomas A. Briody; Steven R. Biren

[57] ABSTRACT

The invention relates to a method of manufacturing a semiconductor device in which a compound consisting of at least two semiconductor materials and having an energy gap which is smaller than that of a substrate is deposited epitaxially on the substrate. According to the invention, the composition of the mixture is determined during the deposition by means of measurement of the thermal emission.

2 Claims, 1 Drawing Figure

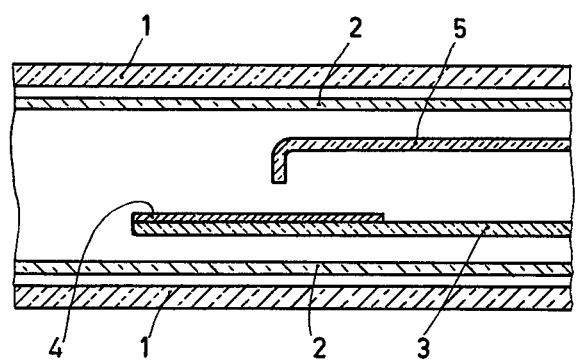

METHOD OF MANUFACTURING A SEMICONDUCTOR DEVICE

The invention relates to a method of manufacturing a semiconductor device in which a compound consisting of at least two semiconductor materials and having an energy gap which is smaller than that of a substrate is deposited epitaxially on the substrate. Semiconductor devices are to be understood to be herein, for example, light-emissive diodes and photo-cathodes. In photo-cathodes, for example, there may be found a sequence of layers of GaP, $In_xGa_{1-x}P$ and GaAs.

In the manufacture of semiconductor devices having hetero junctions it is desired in connection with a difference in lattice constant and/or coefficient of expansion between a first layer having a first composition and a second layer having a second composition to be provided thereon, to provide an intermediate layer whose composition varies between that of the first composition and that of the second composition.

A deposit of semiconductor material with a gradual transition in composition is often obtained by variations of the concentrations of the components of the semiconductor material in the phase from which the semiconductor material is deposited.

A control of said variations with a view to the desired concentration profiles often is very difficult; it may also be difficult to determine the instant at which the variation of the concentrations is to be terminated, for example, when subsequently material is still to be deposited having a given constant ratio of different materials.

One of the objects of the invention is to avoid the difficulties of the known method at least for the greater part. It is inter alia based on the recognition that this is possible in a comparatively simple manner in cases in which semiconductor material having a decreasing energy gap is to be deposited.

Therefore, according to the invention, the composition of the mixture is determined during the deposition by means of measurement of thermal emission.

Radiation emitted by deeper situated layers is absorbed before it reaches the surface because the energy gap is smaller there.

The thermal emission can be readily measured at the usual growth temperature of 700 to 800° C.

Upon absorption of radiation of the semiconductor material, substantially no radiation is absorbed having a wavelength larger than that which corresponds to the energy gap. Analogously, no radiation is emitted in the same long-wave range. The thermal emission is therefore determined in the long-wave part of the spectrum because the emission there strongly depends on the wavelength and hence on the energy gap and on the composition at the surface.

This applies in particular when direct semiconductor material is deposited in which the transition between emission or non-emission is sharply dependent on the wavelength.

However, the invention is not restricted to the controlled deposition of direct semiconductor material. Although with indirect semiconductor material the transition between emission or non-emission is less sharp, the method is nevertheless useful, and in addition that part of the thermal emission spectrum can often also be used where the part corresponding to direct junctions and the part with indirect junctions overlap each other.

The invention will now be described in greater detail with reference to the accompanying drawing and various examples.

The drawing is a diagrammatic sectional view of a part of a device for carrying out the method according to the invention. A furnace 1 comprises a reactor tube 2 in which semiconductor material is deposited on a substrate 4 positioned on a substrate holder 3 by means of gaseous phase epitaxy. The semiconductor material is a compound consisting of at least two semiconductor materials having an energy gap which is smaller than that of the substrate. According to the invention, the composition of the compound is determined during the deposition by means of measurement of the thermal emission.

For example, the radiation emitted by the surface of the deposited material is passed out of the furnace via a quartz rod 5 serving as a light conductor. The radiation is analyzed by means of a monochromator having wavelength adjustment.

The largest intensity differences occur with those wavelengths which correspond to the the energy gap of direct semiconductor material or to the part of the emission spectrum where direct and indirect junctions overlap each other.

During the deposition, either the temperature must be kept constant, or temperature variations must be corrected. According to the invention a photo-cathode can be manufactured as follows.

A gallium-indium-phosphide layer ($Ga_{0.5}In_{0.5}P$, $E_g = 1.9$ eV) is to be deposited on a gallium phosphide substrate (energy gap $E_g = 2.3$ eV).

In order to bridge the difference in lattice constant between the GaP-layer (r = 5.45 Å) and the $Ga_{0.5}In_{0.5}P$-layer (r = 5.65 Å), a layer with decreasing energy gap is deposited on the GaP-layer.

For this purpose there is usually used, for example, a gas flow containing gallium monochloride and phosphorus trichloride in hydrogen as a carrier gas, from which gallium phosphide is deposited at approximately 700° C.

The gallium monochloride in the gas flow is gradually replaced by the indium monochloride until the limit of the thermal emission has risen to a value of the wavelength equal to 0.67 μm, which corresponds to a composition of the depositing material which is equal to the desired composition.

The composition of the gas flow passed over the substrate is then kept constant to obtain the gallium-indium-phosphide layer, after which a gallium arsenide layer is provided thereon (r = 5.65 Å).

The resulting system of layers is further processed in the usual manner to form a photo-cathode.

In an analogous manner a light-emissive diode can be obtained, for example, starting from a gallium phosphide substrate on which, after a layer with decreasing energy gap of gallium arsenide phosphide, a layer of constant composition (GaAsP) is provided. After the formation of a pn junction in the last-mentioned layer, light-emissive diodes can be obtained in a usual manner.

The invention is not restricted to the Examples described. It will be obvious to those skilled in the art that many variations are possible without departing from the scope of this invention.

For example, the invention is not restricted to the deposition on a substrate of a layer having a continuously decreasing energy gap.

The invention may be used, for example, for the deposition of a layer of indium-gallium-arsenide-phosphide ($In_{0.88}Ga_{0.12}As_{0.23}P_{0.77}$) on InP to obtain photocathodes or diode lasers in which the layer has substantially the same lattice constant as the substrate.

However, the layer does have a smaller energy gap than the substrate. If initially the layer to be grown proves to have too large an energy gap the composition of the mixture can be readjusted by means of the method according to the invention.

What is claimed is:

1. A method of manufacturing a semiconductor device which comprises the steps of:

providing a semiconductor substrate;

epitaxially depositing on said substrate a compound comprising at least two semiconductor materials and having an energy gap which is smaller than that of the substrate;

measuring the thermal emission spectrum of the epitaxially deposited compound during deposition; and controlling the composition of said compound during deposition as a function of its measured thermal emission spectrum.

2. A method of manufacturing a semiconductor device as in claim 1, wherein the epitaxially deposited compound comprises a direct semiconductor material.